(12) United States Patent
Zhang

(10) Patent No.: US 8,138,633 B2
(45) Date of Patent: *Mar. 20, 2012

(54) ELECTRONIC POWER-SAVING DEVICE

(76) Inventor: Jiayi Zhang, Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/066,695

(22) Filed: Apr. 20, 2011

(65) Prior Publication Data

US 2011/0204970 A1    Aug. 25, 2011

Related U.S. Application Data

(63) Continuation of application No. 11/990,610, filed on Feb. 15, 2008, now Pat. No. 7,952,235.

(51) Int. Cl.
*H02M 1/12* (2006.01)
(52) U.S. Cl. ........................................... 307/105
(58) Field of Classification Search .............. 323/235, 323/268, 273, 282; 307/105
See application file for complete search history.

(56) References Cited

U.S. PATENT DOCUMENTS

| | | | | |
|---|---|---|---|---|
| 3,588,721 | A * | 6/1971 | Keller | 329/338 |
| 5,013,993 | A * | 5/1991 | Bhagwat et al. | 320/150 |
| 6,914,421 | B2 * | 7/2005 | Yamamoto | 323/289 |

* cited by examiner

*Primary Examiner* — Adolf Berhane
(74) *Attorney, Agent, or Firm* — Raymond Y. Chan; David and Raymond Patent Firm

(57) ABSTRACT

A single-phase electronic power-saving device includes at least one power-saving unit. The power-saving unit includes two ceramic piece capacitors, a safe capacitor, an inductor, a SCR, a first resistor, a second resistor, a live wire and a zero line; the two ceramic piece capacitors connected in series as a whole is connected in parallel with the safe capacitor to two terminals of which are connected the anode and the cathode of SCR, respectively; the anode of SCR is also connected to one terminal of the inductor, the branch composed of the first and the second resistors connected in series is connected in parallel so that one terminal of which is connected to one terminal of the inductor and the other is connected to the cathode of SCR; the gate of SCR is connected between the first and the second resistors.

5 Claims, 5 Drawing Sheets

Smoothed current

Before installation

After installation

ELECTRONIC POWER-SAVING DEVICE

CROSS REFERENCE OF RELATED APPLICATION

This is a Continuation application that claims benefit of priority under 35 U.S.C. §119 to a non-provisional application, application Ser. No. 11/990,610, filed Feb. 15, 2008 now U.S. Pat. No. 7,952,235.

BACKGROUND OF THE PRESENT INVENTION

1. Field of Invention

The present invention relates to a power-saving device, and more particularly to a single-phase electronic power-saving device, and a three-phase electronic power-saving device.

2. Description of Related Arts

Shortages of power sources, including electrical power, are always a problem. It is a trend to utilize scientific technology to save energy, prevent waste, and protect electric devices, in order to achieve environmental protection. In China, a large amount of devices are consuming much more electrical power comparing to the similar devices used in developed countries. The electrical power consuming in residential and commercial fields are also extremely demanding. Unfortunately, most of electrical systems have no power-saving processes, and cause a lot power waste. As a result, the consequent pollution is also increasing. At present, 70% of electrical power used in China is produced by burning coal. To produce every 1 kWh of electric energy, it will emit 1100 g of $CO_2$, about 9 g of $SO_2$, and about 4.4 g of nitrogen oxides into the air.

There are some power-saving devices in the market. For example, single function power-saving devices such can be used for air conditioners and refrigerators, or energy saving bulbs. But these devices, no matter is single-phase or three-phase, are all share the problems such as complex, expensive, limited application, and are hard to promote.

SUMMARY OF THE PRESENT INVENTION

In order to overcome the disadvantages, the present invention provides an improved electronic single-phase or three-phase power-saving device.

In one objective, the present invention provides an electronic power-saving device, which comprises at least one power-saving unit. The power-saving unit comprises two ceramic capacitors, a safety capacitor, an inductor, a silicon controlled rectifier (SCR), a first resistor, a second resistor, a live wire, a neutral wire, and a fuse. The two ceramic capacitors are electrically connected in series, and as a whole are electrically connected with the safety capacitor in parallel. The two terminals are then electrically connected with the anode and the cathode of the SCR respectively. The anode of the SCR is also electrically connected to one terminal of the inductor. The first and second resistors are electrically connected in series and then electrically connected with the anode and cathode of the SCR respectively. The gate of the SCR is electrically connected with the junction of the first and second resistors. The two terminals of the two ceramic capacitors in series are further electrically connected with the live wire and the neutral wire respectively. The fuse is electrically connected with the live wire in series.

Preferably, the device further comprises an indicator, and a ground wire arrangement. The indicator is electrically connected with a third resistor in series. Another terminal of the third resistor is electrically connected with the junction of the first resistor and the inductor. Another terminal of the indicator is electrically connected with the junction of the second resistor and the safety capacitor. The ground wire arrangement is made of metal and encircles the elements of the device.

In another objective, the present invention provides an electronic power-saving device, which comprises at least two power-saving units. Each power-saving unit comprises two ceramic capacitors, a safety capacitor, an inductor, an SCR, a first resistor, a second resistor, a live wire, a neutral wire, and a fuse. The two ceramic capacitors are electrically connected in series, and as a whole are electrically connected with the safety capacitor in parallel. The two terminals are then electrically connected with the anode and the cathode of the SCR respectively. The anode of the SCR is also connected to one terminal of the inductor. The first and second resistors are electrically connected in series and then electrically connected with the anode and cathode of the SCR respectively. The gate of the SCR is electrically connected with the junction of the first and second resistors. The two terminals of the two ceramic capacitors in series are further electrically connected with the live wire and the neutral wire respectively. The fuse is electrically connected with the live wire in series.

Preferably, each power-saving unit of the device further comprises an indicator, and a ground wire arrangement. The indicator is electrically connected with a third resistor in series. Another terminal of the third resistor is electrically connected with the junction of the first resistor and the inductor. Another terminal of the indicator is electrically connected with the junction of the second resistor and the safety capacitor. The ground wire arrangement is made of metal and encircles the elements of the device.

Preferably, the two power-saving units have the same capability, or have different capabilities.

Preferably, the device comprises at least three power-saving units. These power-saving units are electrically connected parallelly by the two terminals of the two ceramic capacitors in series, and are also electrically connected with the live wire and the neutral wire respectively.

In another objective, the present invention provides a three-phase electronic power-saving device, which comprises three single-phase electronic power-saving devices. Each single-phase electronic power-saving device comprises at least two power-saving units. Each power-saving unit comprises two ceramic capacitors, a safety capacitor, an inductor, an SCR, a first resistor, a second resistor, a live wire, a neutral wire, and a fuse. The two ceramic capacitors are electrically connected in series, and as a whole are electrically connected with the safety capacitor in parallel. The two terminals are then electrically connected with the anode and the cathode of the SCR respectively. The anode of the SCR is also electrically connected to one terminal of the inductor. The first and second resistors are electrically connected in series and then connected with the anode and the cathode of the SCR respectively. The gate of the SCR is electrically connected with the junction of the first and second resistors. The two terminals of the two ceramic capacitors in series are further electrically connected with the live wire and the neutral wire respectively. The fuse is connected with the live wire in series.

Preferably, the device further comprises a ground wire arrangement which is made of metal and encircles the elements of the device. Each power-saving unit of every single-phase electronic power-saving device further comprises an indicator. The indicator is electrically connected with a third resistor in series. Another terminal of the third resistor is electrically connected with the junction of the first resistor and the inductor. Another terminal of the indicator is electrically connected with the junction of the second resistor and the safety capacitor.

Preferably, the two power-saving units in each single-phase electronic power-saving device are the same, or have different capabilities.

Preferably, each single-phase electronic power-saving device comprises at least three power-saving units. These power-saving units are electrically connected parallelly by the two terminals of the two ceramic capacitors in series, and are also electrically connected with the live wire and the neutral wire respectively.

The present invention provides a single-phase or three-phase electronic power-saving device. It integrates the power-saving elements to regulate the current in complex and multi level process. The device can stabilize the waved voltage and the pulse current, decrease the temperature of the wires, reduce the power waste, and protect the equipments. The power-saving efficiency is generally 20% to 30%.

These and other objectives, features, and advantages of the present invention will become apparent from the following detailed description, the accompanying drawings, and the appended claims.

DETAILED DESCRIPTION OF THE PREFERRED EMBODIMENT

Referring to FIGS. 1 to 6 of the drawings, a single-phase electronic power-saving device and a three-phase electronic power-saving device, according to a preferred embodiment of the present invention are illustrated.

Figure 1:
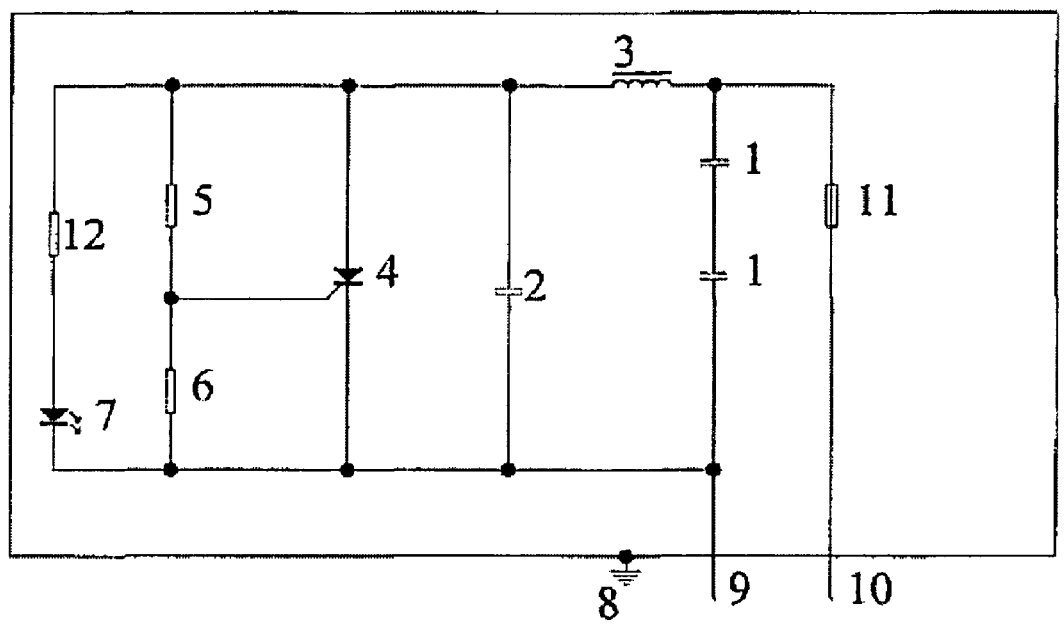
FIG. 1 is a circuit diagram of the single-phase electronic power-saving device of the first embodiment of the present invention.

Referring to FIG. 1, the first embodiment of the single-phase electronic power-saving device is illustrated. The single-phase electronic power-saving device comprises two ceramic capacitors 1, a safety capacitor 2, an inductor 3, a SCR 4, a first resistor 5, a second resistor 6, an indicator 7, a ground wire arrangement 8, a live wire 9, a neutral wire 10, a fuse 11, and a third resistor 12. In this embodiment, the first resistor is 1K and the second resistor is 1M, wherein these two resistors are used to divide voltage. The two ceramic capacitors 1 are electrically connected in series, and then are electrically connected with the safety capacitor 2 in parallel. Between the safety capacitor 2 and the ceramic capacitor 1, there is also an inductor 3 are electrically connected. The two terminals of the safety capacitor 2 are then electrically connected with the anode and cathode of the SCR 4 respectively. The anode of the SCR 4 is also electrically connected to one terminal of the inductor 3. The second resistor 6 and the first resistor 5 are electrically connected in series and then connected with the anode and cathode of the SCR 4 respectively. The gate of the SCR 4 is electrically connected with the junction of the first resistor 5 and the second resistor 6. The indicator 7 is electrically connected with a third resistor 12 in series. Another terminal of the third resistor 12 is electrically connected with the junction of the first resistor 5 and the inductor 3. Another terminal of the indicator 7 is electrically connected with the junction of the second resistor 6 and the safety capacitor 2. The two terminals of the two ceramic capacitors 1 in series are further electrically connected with the neutral wire 9 and the live wire 10 respectively. The fuse 11 is electrically connected with the live wire 10 in series for protection. The ground wire arrangement 8 is made of metal and encircles the peripheral of elements of the device.

In the present invention, the ceramic capacitor 1 and safety capacitor 2 are elements which can store electrical energy. During the charging and discharging, the ceramic capacitor 1 and the safety capacitor 2 will stabilize the voltage. The safety capacitor 2 and the inductor 3 are electrically connected in series, and the inductor 3 can prevent the change of the current, and avoid disturbance of the voltage. The SCR 4 is used as a controllable switch, wherein it can control relatively large unstable voltage through relatively small energy. The first resistor 5 and the second resistor 6, which are used as voltage division, supply voltage to the safety capacitor 2, inductor 3, SCR 4, and indicator 7. The ground wire arrangement 8 is for circuit protection. The fuse 11 is used to protect the power-saving device.

Figure 2:
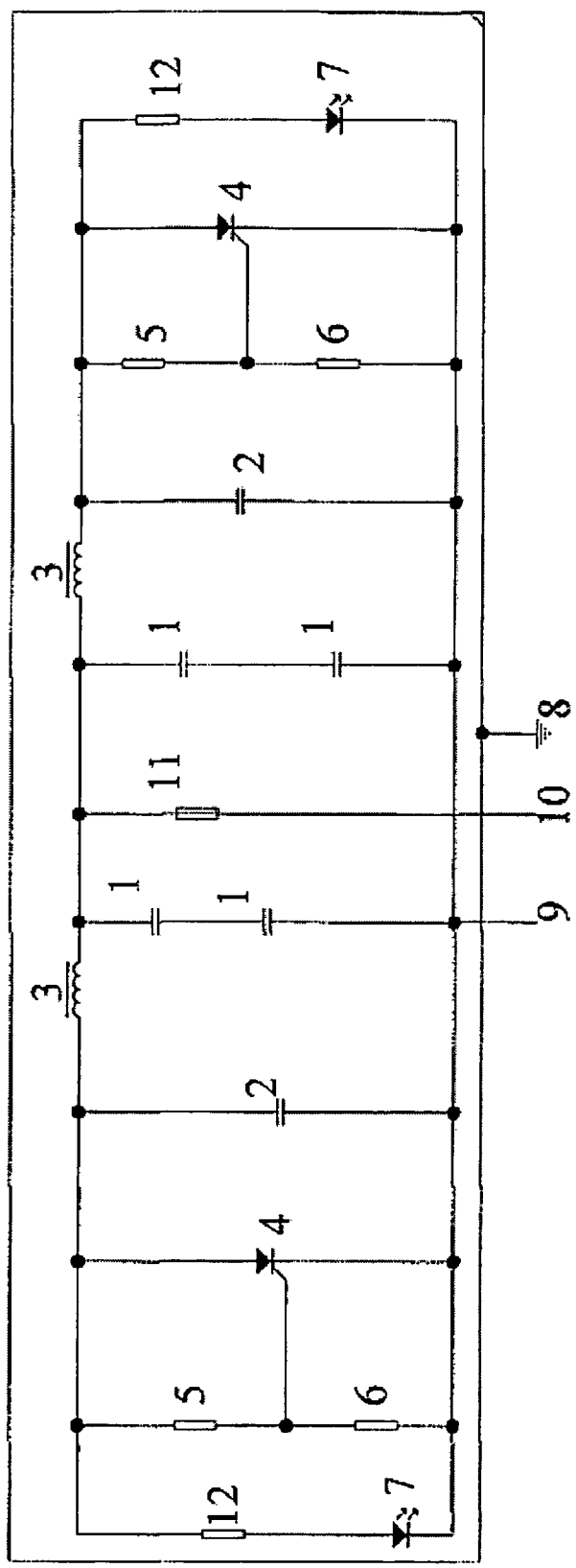
FIG. 2 is a circuit diagram of the single-phase electronic power-saving device of the second embodiment of the present invention.

Referring to FIG. 2, the second embodiment of the single-phase electronic power-saving device is illustrated. In this embodiment, the single-phase electronic power-saving device comprises two power-saving units, named as a strong power-saving unit, and a weak power-saving unit respectively, electrically coupled with each other. The structures of the two power-saving units are same. Each of the power-saving units comprises two ceramic capacitors 1, a safety capacitor 2, an inductor 3, a SCR 4, a first resistor 5, a second resistor 6, an indicator 7, a ground wire arrangement 8, a live wire 9, a neutral wire 10, a fuse 11, and a third resistor 12. The structure of each unit is illustrated as FIG. 1. The difference between these two units is that the charge of the elements 1 to 4, i.e. the ceramic capacitors 1, the safety capacitor 2, the inductor 3 and the SCR 4. Accordingly, the charge of the ceramic capacitors 1, the safety capacitor 2, the inductor 3 and the SCR 4 of the strong power-saving unit is larger than the charge of the ceramic capacitors 1, the safety capacitor 2, the inductor 3 and the SCR 4 of the weak power-saving unit. In the embodiment, the power-saving units are electrically connected in series that the ceramic capacitors 1 of one of the power-saving units are electrically connected with the ceramic capacitors 1 of another power-saving unit in parallel. The two terminals of the two ceramic capacitors 1 in series are further electrically connected with the neutral wire 9 and the live wire 10 respectively. Also the device comprises a ground wire arrangement 8.

In the present invention, the two power-saving units could be the same, which means no difference in the charging. The device can comprise more than two power-saving units, and the units are electrically connected with the neutral wire 9 and the live wire 10 through the two terminals of the two ceramic capacitors 1 in series.

Figure 3:
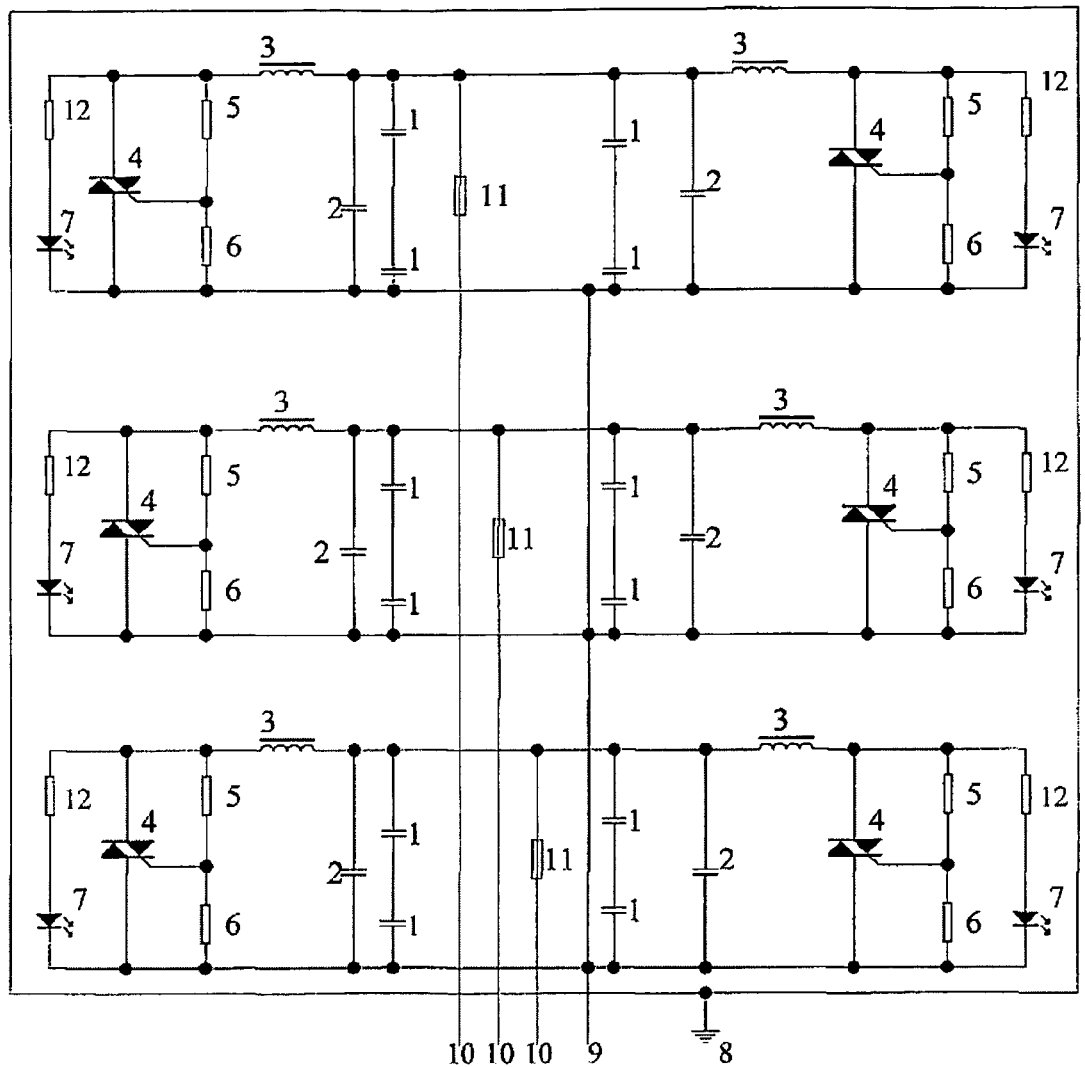
FIG. 3 is a circuit diagram of the three-phase electronic power-saving device of the present invention.

Referring to FIG. 3, the embodiment of the three-phase electronic power-saving device is illustrated. The three-phase electronic power-saving device is integrated by three single-phase electronic power-saving units. Each single-phase electronic power-saving unit is the same which is illustrated in FIG. 2. In this device, all the neutral wires 9 of the three single-phase electronic power-saving devices are electrically connected together to form a common neutral wire. The three live wires 10 of the three single-phase electronic power-saving devices are electrically connected in parallel, such that the three live wires 10 are extended separately.

The process of the installation of the present invention is:

For single-phase electronic power-saving device, generally speaking, the consumer electronic equipment can connected with one set (or multiple sets in parallel). It is better to be installed after the ammeter, and before the equipment. Connect the neutral wire with the neutral wire of the power source, connect the live wire with the live wire of the power source, and connect the ground wire arrangement with the ground wire. If necessary, the first embodiment illustrated in FIG. 1 and the second embodiment illustrated in FIG. 2 can be paralleled to use.

For three-phase electronic power-saving device, the process comprises the steps of: connecting the neutral wire with the neutral wire of the power source, connecting the three live wires with the live wires of the power source, and connecting the ground wire arrangement with the ground wire. It is better to install the device after the ammeter, and before the equipments or motors. The installation can be adjusted according to the electric load and the types of the equipments. For example, multiple three-phase electronic power-saving devices can be used for larger load.

Figure 4:
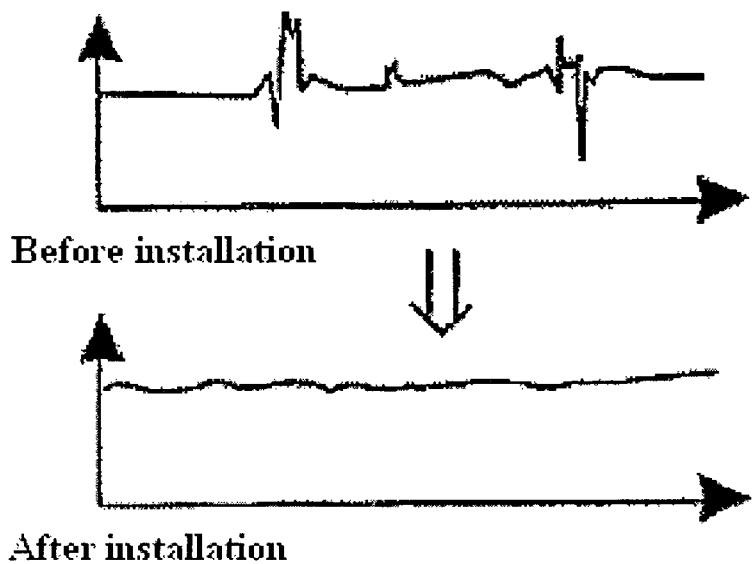
FIGS. 4 to 6 illustrate the concepts of the present invention to save power.
Figure 5:
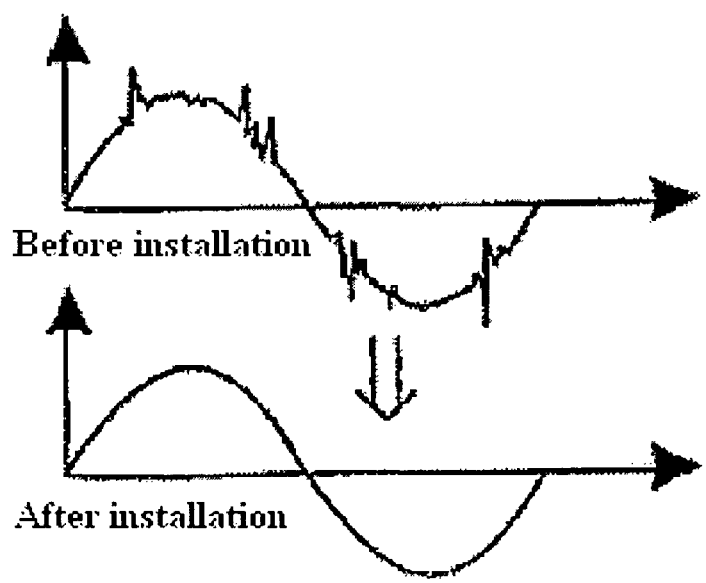
Figure 6:
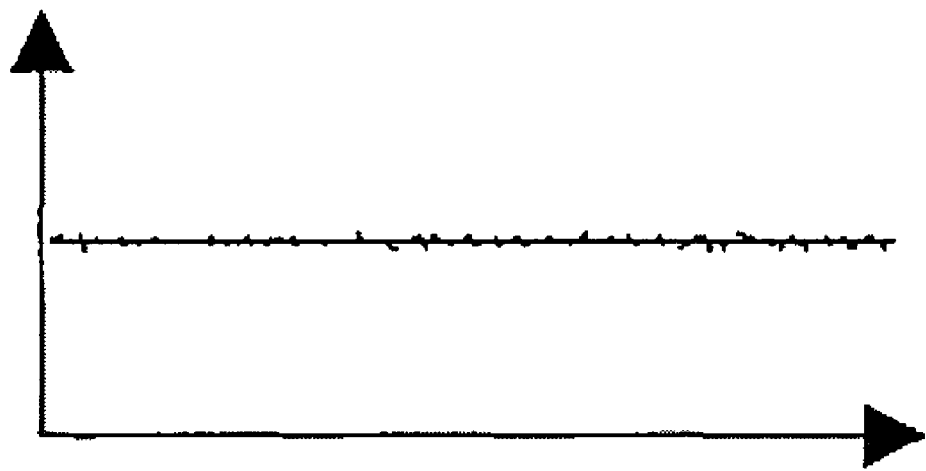
Figure 6:
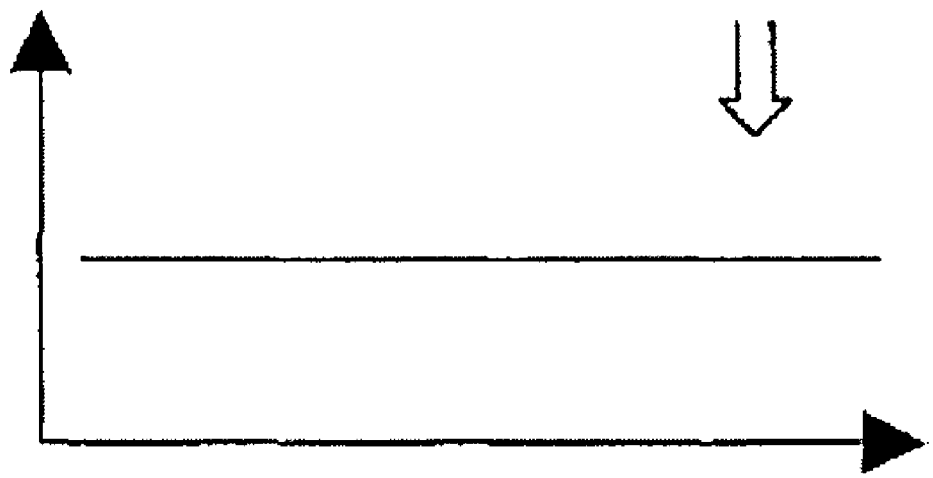

FIGS. 4 to 6 explain the theory of the power-saving device, and illustrate the difference of the current and voltage before and after using the device. Referring to the FIGS. 4 to 6, before using the power-saving device, the voltage of the power source is not stable, and has different pulses. It obviously will introduce energy waste. After using the power-saving device, the voltage of the power source is stabilized, the pulses are filtered. The smoothed current will reduce the energy waste, reduce the wire temperature, and protect the equipments.

The present invention can be used to gradually remove the carbon accumulated on the wires which is caused by high-order harmonics. So the longer time of the power-saving device is used, the better the effect is. The present invention has the advantages of simple structure, low cost, and can be wildly used with single-phase electronic equipment, such as air conditioner, refrigerator, motor, computer, water heater, washer, copy machine, lights; or use with three-phase electronic equipment such as central air conditioner, refrigeration system, water pump, air compressor, injection molding machine, and other three-phase electric machines, motors. It is valuable in industry and residential applications, the power-saving efficiency can be 20%~30%.

One skilled in the art will understand that the embodiment of the present invention as shown in the drawings and described above is exemplary only and not intended to be limiting.

It will thus be seen that the objects of the present invention have been fully and effectively accomplished. It embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. An electronic power-saving device, comprising two power-saving units electrically coupled with each other, wherein each of said power-saving units comprises:

two ceramic capacitors being electrically connected in series;

a safety capacitor electrically connected to said two ceramic capacitors in parallel;

an inductor;

a silicon controlled rectifier (SCR), wherein two terminals of said safety capacitor are electrically connected with an anode and a cathode of said SCR respectively, wherein said anode of said SCR is electrically connected to one terminal of said inductor; and first and second resistors electrically connected in series, wherein said first and second resistors are electrically connected with said anode and said cathode of said SCR respectively, wherein the gate of said SCR is electrically connected with the junction of said first and second resistors;

wherein one of said power-saving units is a strong power-saving unit while another said power-saving unit is a weak power-saving unit, wherein the charge of said ceramic capacitors, said safety capacitor, said inductor, and said SCR of said strong power-saving unit is larger than the charge of said ceramic capacitors, said safety capacitor, said inductor, and said SCR of said weak power-saving unit.

2. An electronic power-saving device, comprising three power-saving units to form a three-phase power saving unit, wherein each of said power-saving units comprises:

two ceramic capacitors being electrically connected in series;

a safety capacitor electrically connected to said two ceramic capacitors in parallel;

an inductor;

a silicon controlled rectifier (SCR), wherein two terminals of said safety capacitor are electrically connected with an anode and a cathode of said SCR respectively, wherein said anode of said SCR is electrically connected to one terminal of said inductor; and first and second resistors electrically connected in series, wherein said first and second resistors are electrically connected with said anode and said cathode of said SCR respectively, wherein the gate of said SCR is electrically connected with the junction of said first and second resistors;

wherein each of said power-saving units further comprises a live wire and a neutral wire electrically connected with two terminals of said ceramic capacitors respectively, and a fuse electrically connected with said live wire in series, wherein said three neutral wires of said power-saving units are electrically connected together to form a common neutral wire.

3. The electronic power-saving device, as recited in claim 2, wherein said three live wires of said power-saving units are electrically extended in parallel.

4. The electronic power-saving device, as recited in claim 3, wherein said power-saving units have the same capability.

5. The electronic power-saving device, as recited in claim 3, wherein said power-saving units have the different capabilities.

* * * * *